United States Patent [19]

Akatsuka

[11] 4,338,678

[45] Jul. 6, 1982

[54] MEMORY DEVICE

[75] Inventor: Yasuo Akatsuka, Tokyo, Japan

[73] Assignee: Nippon Electric Co., Ltd., Tokyo, Japan

[21] Appl. No.: 147,786

[22] Filed: May 8, 1980

[30] Foreign Application Priority Data

May 10, 1979 [JP] Japan .................................. 54/57250

[51] Int. Cl.³ ............................................ G11C 11/40
[52] U.S. Cl. ....................................... 365/174; 365/76
[58] Field of Search ................. 365/174, 76, 184, 221

[56] References Cited

U.S. PATENT DOCUMENTS 3,813,650  5/1974  Hunter ................................ 365/200

*Primary Examiner*—Terrell W. Fears
*Attorney, Agent, or Firm*—Sughrue, Mion, Zinn, Macpeak & Seas

[57] ABSTRACT

A memory device operable at high speed is disclosed. The device comprises selection means coupled to word lines for selecting one of them detection means for detecting a signal appearing in the selected word line, and word line drive means responsive to an output of the detection means for supplying the selected word line with a voltage capable introducing a selection level in it independent on the selection means.

15 Claims, 14 Drawing Figures

MEMORY DEVICE

The present invention relates to a memory device, and particularly to a semiconductor memory device (IC memory) fabricated on a semiconductor substrate.

The degree of integration and operation speed of an IC memory have been increasing. In the IC memories, a polycrystalline silicon layer are widely employed for forming word lines because they are suitable for small-sized, fine patterning and enable self-aligning between semiconductor regions and silicon gates. However, a sheet resistance of the polycrystalline silicon is larger than conventional metal material. Accordingly between the both ends of word lines formed of the polycrystalline silicon, a relatively large impedance inevitably exists, and hence a large time constant (i.e. delay) which is formed by the impedance and capacitance of the word line is resultantly produced between the both ends of the word line. This delay in the word line occupies a large part of a total delay in the whole memory circuit and occupies 20~30% of an access time. Thus, the improvement in the access time cannot be expected in view of the structure of the word line.

It is an object of the present invention to provide a memory device operable at a high speed.

It is another object of the present invention to provide a memory device having large memory capacity.

A memory device according to the present invention comprises a plurality of word lines, a plurality of data lines, a plurality of memory cells arranged at the respective intersections of the word lines and data lines, a word decoder circuit having a plurality of selection outputs, a plurality of first word driver circuits respectively receiving one of the selection outputs for providing a portion of the associated word line with a voltage capable introducing therein a selection level, a plurality detection circuits respectively coupled to another portion of the associated word line for detecting a change toward the selection level therein to produce a detection signal, and a plurality of second word driver circuits respectively responsive to the detection signal from the associated detection for providing another portion of the associated word line with a voltage capable of introducing the selection level.

In the above memory device, the driving ability of the second word drive circuits is favorably set larger than the first word drive circuits.

The detection circuit may be made of an inverter circuit having an input coupled to another portion of the word line and the second word drive circuit may be made of an insulated-gate field-effect transistor (IGFET) coupled between a power supply and another portion of the word line, a gate of which is supplied with the detection signal.

According to the present invention, the word line can be provided with the voltage for introducing the selection level at a plurality of different portions (i.e. "a portion" and "another portion") thereof and hence as a whole the selected word line can be quickly turned to the selection level without influence of its time constant. As a result, high speed operation can be achieved.

Furthermore, the driving ability of the first word drive circuits may be small and hence IGFETs forming them can be made small size. As a whole, the memory device according to the present invention can be with high integration.

First, with reference to FIGS. 1 to 4, a semiconductor memory device according to the prior art will be described.

Figure 1:
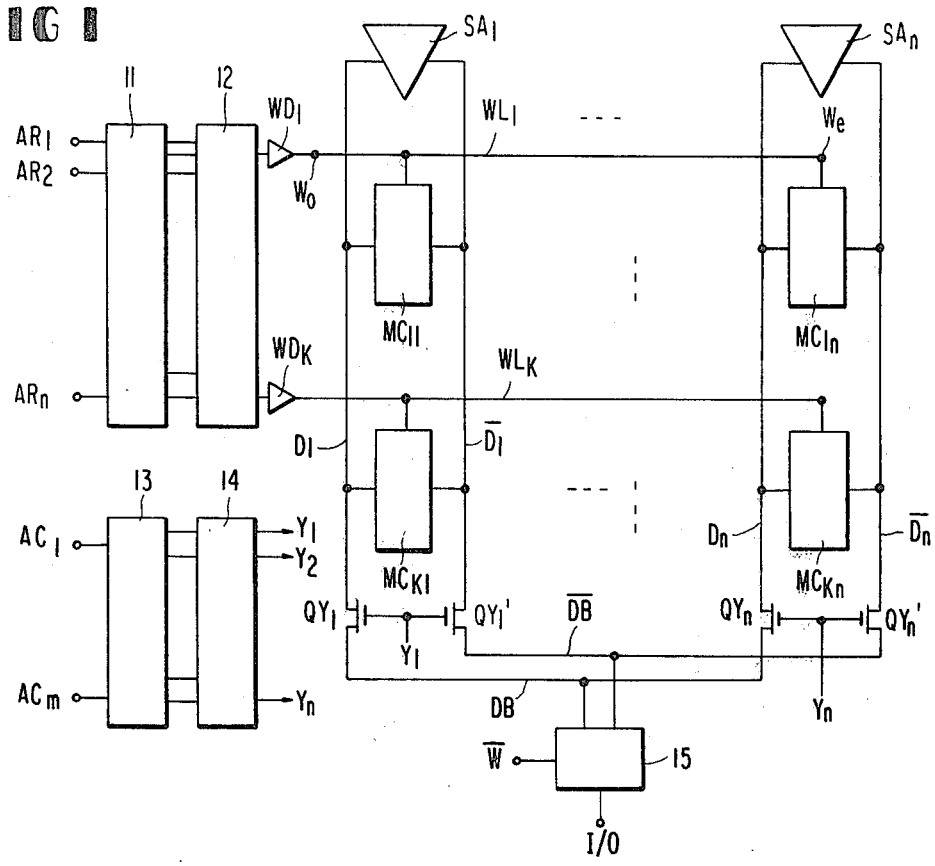
FIG. 1 is a block diagram showing a conventional memory device.

A whole structure of the memory device is shown in FIG. 1. A row address inverter buffer 11 receives a plurality of row address signals $AR_l \sim AR_n$ to produce their true and complementary address signals. A row decoder 12 receives the true and complementary address signals and makes one of its n pieces of outputs at a selection level. A plurality of word driver circuits $WD_l \sim WD_k$ are respectively coupled between a plurality of word lines $WL_l \sim WL_k$ and the outputs of the decoder 12. The word driver circuits $WD_l \sim WD_k$ selectively drive one of the word line between the selection level and the nonselection level. A plurality pairs of digit lines $D_1, \overline{D_2} \ldots D_n, \overline{D_n}$ intersect the word lines $WL_l \sim WL_k$. At the respective intersection of the word lines and the digit line pairs, a plurality of memory cells $MC_{ll} \sim MC_{kn}$ and arranged. Digit data sense circuits $SA_l \sim SA_n$ amplify data read on the digit line pairs. A column address inverter buffer 13 receives a plurality of column address input signals $AC_l \sim AC_m$ and produces their true and complementary address signals. A column decoder 14 receives the address signals from the column address inverter buffer 13 and makes one of its selection outputs $Y_l \sim Y_n$ at the selection level. True and complementary read data on the digit line pairs are transferred to a pair of bus lines DB and $\overline{DB}$ through a plurality pairs of transfer gate transistors $QY_l, QY_l' \ldots QY_n, QY_n'$. An input/output circuit 15 coupled to the bus lines DB and $\overline{DB}$ is controlled by a write enable signal $\overline{W}$ between a read mode and a write mode and outputs read-out data at an input output common terminal I/O or transfers write data applied to the terminal I/O to the bus lines DB and $\overline{DB}$.

Figure 2:
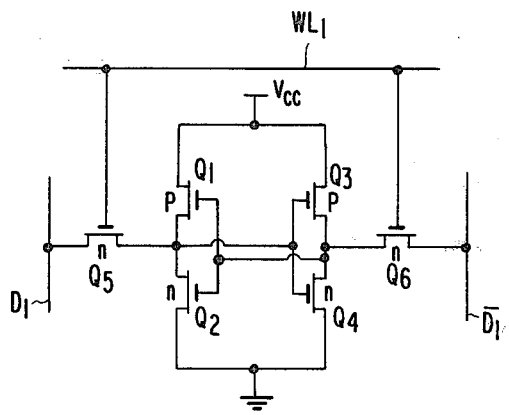
FIG. 2 is a circuit diagram showing a memory cell.

FIG. 2 shows a structure of the memory cells ($MC_{ll} \sim MC_{kn}$) shown in FIG. 1.

The memory cells P-channel IGFETs $Q_1$ and $Q_3$, and N-channel IGFETs $Q_2$, $Q_4$, $Q_5$ and $Q_6$. IGFETs $Q_1$ to $Q_4$ form a flip-flop circuit as a bi-stable circuit. IGFETs $Q_5$ and $Q_6$ have gates coupled to the word line (e.g. $WL_l$) and transfer a true and a complementary output signals of the flip-flop circuit to the pair of digit lines (e.g. $D_1$ and $\overline{D_2}$).

Figure 3:
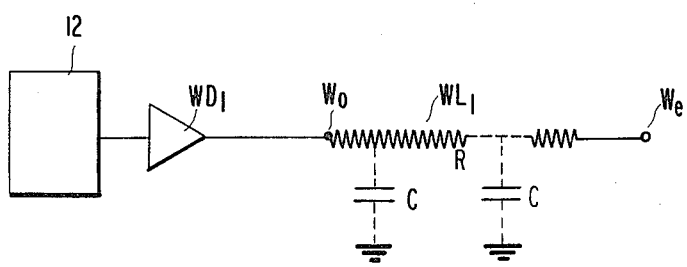
FIG. 3 is a circuit diagram showing a word line of FIG. 1.
Figure 4:
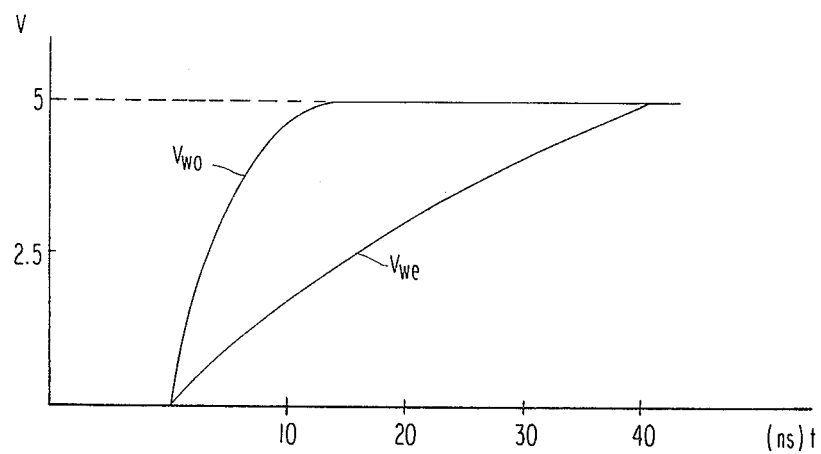
FIG. 4 is a wave form diagram showing changes in level of the word line in FIG. 3.

With reference to FIGS. 3 and 4, a problem in the word line of the prior art memory device will be described.

In FIG. 3, the word line $WL_l$ is usually made of a porycrystalline silicon having a sheet resistance and has a relatively large resistance R in its longitudinal direction. Also large capacitance C including its stray capacitance and load capacitance is attached to the word line $WL_l$. Thus, the word line $WL_l$ inevitable has a large time constant ($R \times C$) in its longitudinal direction, and hence access to the memory cell arranged near a remote end $W_e$ of is delayed with a large extent.

Waveforms of a near end $W_o$ to the word driver circuit $WD_l$ and the remote end $W_e$ are shown in FIG. 4. In this case, as a power voltage, 5 V is employed. Waveform $V_{wo}$ shows a voltage change at the near end $W_o$ while waveform $V_{we}$ show a voltage change at the remote end $W_e$. As is clear from FIG. 4, rise of voltage ($V_{we}$) at the remote end $W_e$ is delayed from the rise of $V_{wo}$ bt about 30 nano sec, which occupies a large part in access time. As a result, high speed operation cannot be expected.

Now with reference to FIG. 5, a first embodiment of the present invention will be described.

Figure 5:
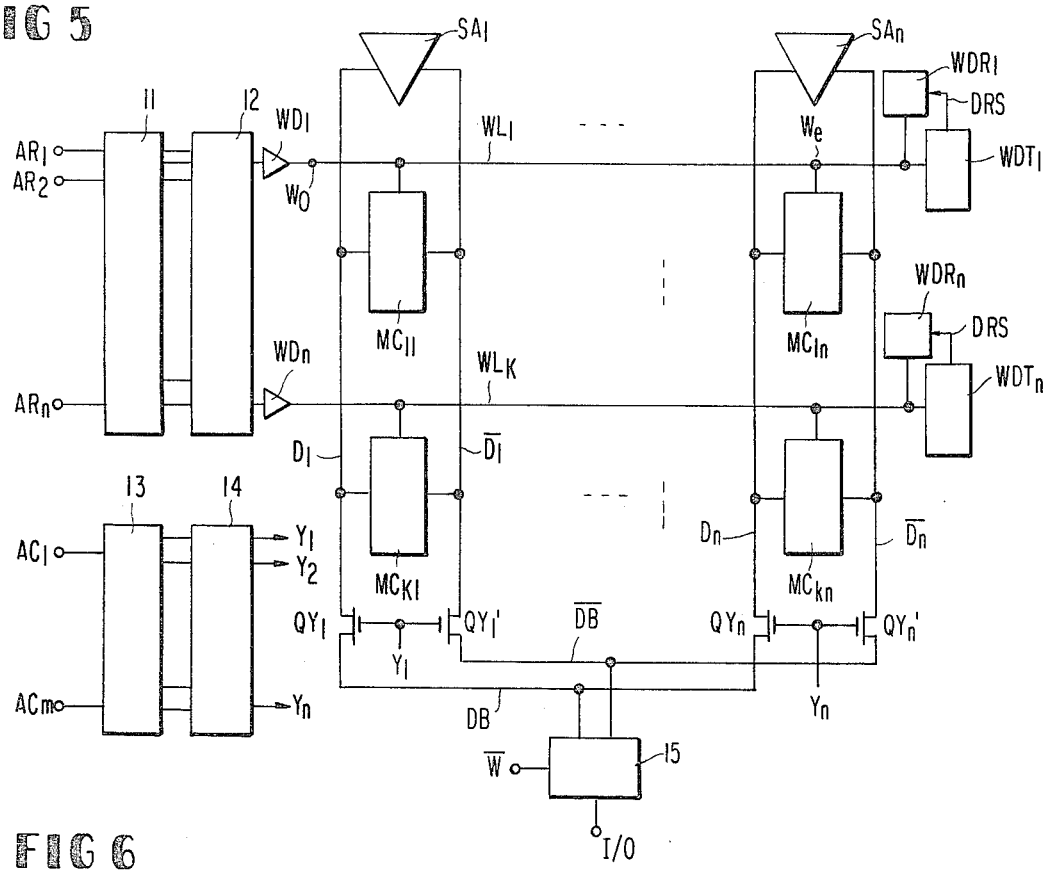
FIG. 5 is a block diagram showing a memory device according to a first embodiment of the present invention.

In FIG. 5, word level detection circuits $WDT_l \sim WDT_n$ are coupled to the respective word lines at their remote end. The word level detection circuits detect an initiation of a change from a nonselection level to a selection level in the respective word lines. If the initiation is detected, the word level detection circuit ($WDT_l$) produces a detection signal DRS and supplies it to an associated select word drive circuit $WDR_l$ or $WDR_n$ coupled to the remote end of the word line ($WL_l$, $WL_n$). The select word circuit $WDR_l$ or $WDR_n$ provides the associated word line with the selection level.

Thus, the word line to be selected is forcibly made at the selection level without the time delay near the remote ends. In this connection, the portion of the word lines to which the word level detection circuit and the select word drive circuit is not limited to the remote end.

Figure 6:
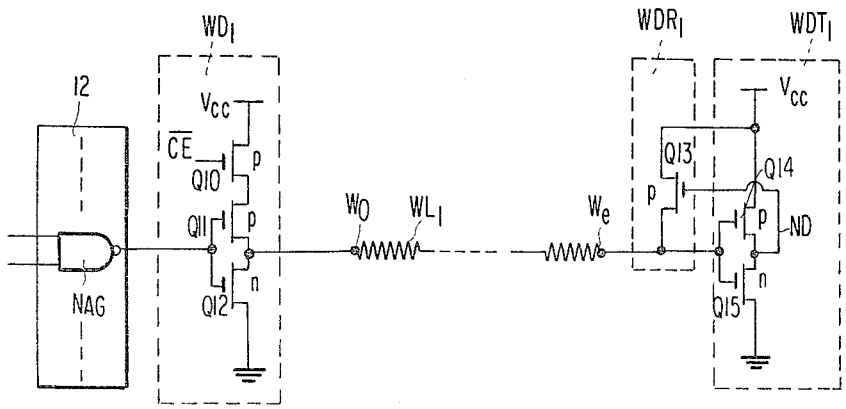
FIG. 6 is a circuit diagram showing a characteristic part of a memory according to a second embodiment of the present invention.
Figure 7:
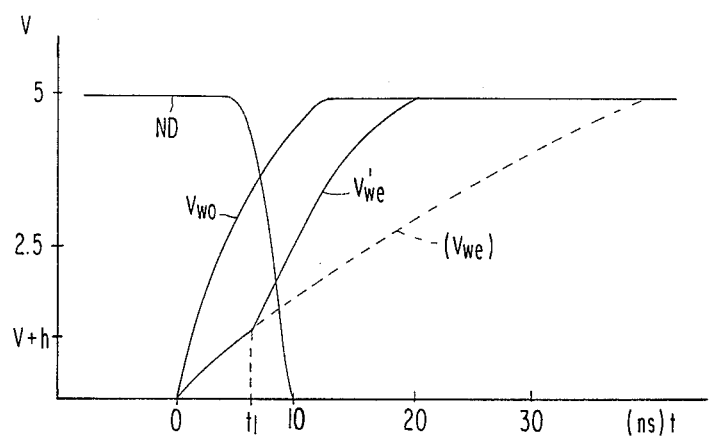
FIG. 7 is a waveform diagram showing an operation of the circuit in FIG. 6.

With reference to FIGS. 6 and 7, a second embodiment of the present will be described in detail.

In FIG. 6, the word drive circuit $WD_l$ comprises P-channel IGFETs $Q_{10}$ and $Q_{11}$ and an N-channel $Q_{12}$. IGFETs $Q_{11}$ and $Q_{12}$ form an inverter circuit receiving a decode signal from a NAND gate NAG forming the decoder 12. IGFET $Q_{10}$ receives a chip enable signal $\overline{CE}$ at its gate and enables the inverter in response to the row level of $\overline{CE}$. An output of the word drive circuit $WD_l$ is applied to a portion of the word line $WL_l$ (in this case the near end $W_o$). The word level detection circuit $WDT_l$ is made of an inverter including P-channel IGFET $Q_{14}$ and an N-channel IGFET $Q_{15}$, whose gates are coupled to a portion of the word line which is different from the portion coupling to the word drive circuit.

The select word drive circuit $WDR_l$ is made of a P-channel IGFET $Q_{13}$ coupled between the power voltage $V_{DD}$ and a portion of the word line (in this case the remote end $W_e$) at its drain and source and receiving an output ND of the circuit $WDT_l$ at its gate.

A selection operation of the circuits shown in will be explained by referring to FIG. 7.

A waveform $V'_{we}$ show a voltage change at the remote end $W_e$ of the word line $WL_l$. At time=0, the word drive circuit $WD_l$ starts to supply the end $W_o$ with the selection level i.e. $V_{cc}$. From this time point, the level $V'_{we}$ starts to rise in the similar curve as in FIG. 4. At this time point $t_l$ the level of $V'_{we}$ exceeds a logic threshold level $V_{th}$ of the inverter including IGFETs $Q_{14}$ and $Q_{15}$ so that the output signal ND starts to fall in level. At the same time, the IGFET $Q_{13}$ conducts. Therefore, the level $V'_{we}$ of the remote end rapidly rises towards the high level (selection level) of 5 V.

Thus, the word line is quickly made at the selection level. As is clear from the figure, the word line can be set at the selective level within about 20 nano sec as a whole and high speed operation is obtained. Here, the threshold level $V_{th}$ is optionally set by the ratio of gm between IGFETs $Q_{14}$ and $Q_{15}$.

Figure 8:
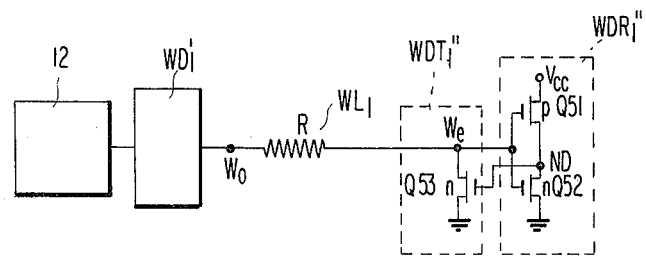
FIG. 8 is a circuit diagram showing a characteristic part of a memory device according to a third embodiment of the present invention.

FIG. 8 shows a third embodiment of the present invention. This embodiment includes a word level detection circuit $WPR_l'$ made of a P-channel IGFET $Q_{51}$ and an N-channel IGFET $Q_{52}$ and a selection word drive circuit $WDT_l'$ made of an N-channel IGFET $Q_{53}$. In this embodiment, the level of a non-selected word line ($WL_l$) is at $V_{cc}$ level and the level of a selected word line is at ground potential. Thus, the operations of the second embodiment are self-explanatory because they can be analogized by inverting the polarity of the second embodiment.

Figure 9:
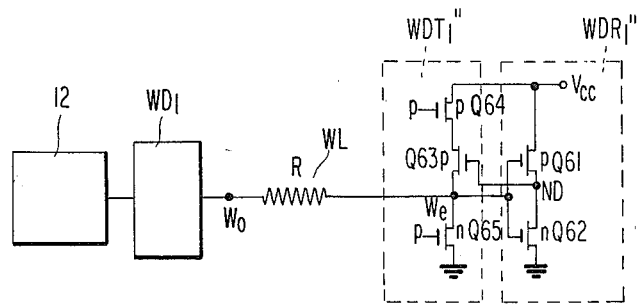
FIG. 9 is a circuit diagram showing a characteristic part of a memory device according to a fourth embodiment of the present invention.

FIG. 9 shows a fourth embodiment of the present invention, in which a reset structure made of is added to the selection word drive circuit $WDT_l''$.

Figure 10:
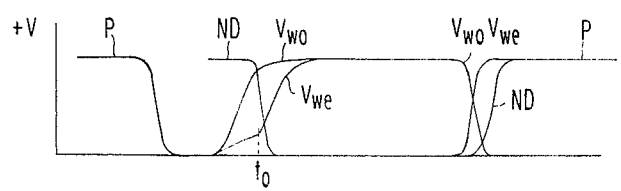
FIG. 10 is a waveform diagram showing an operation of the circuit in FIG. 9.

FIG. 10 is a timing chart showing the operations of the circuit of FIG. 9, in which waveforms $V_{wo}$, $V_{we}$ represent the level at the portions $W_o$ and $W_e$ respectively.

In FIG. 9, the word level detection circuit $WDR_l''$ includes a P-channel IGFET $Q_{61}$ and an N-channel IGFET $Q_{62}$ and has the same structure as the circuit $WDR_l$ in FIG. 6. The IGFETs $Q_{64}$ and $Q_{65}$ have their respective gates supplied with reset signals P so that the IGFET $Q_{64}$ is rendered conductive whereas the IGFET $Q_{65}$ is rendered nonconductive when the reset signal P is at a low level to introduce an active period. Thus, this embodiment operates similarly to the first embodiment during the active period. On the contrary, when the reset signals P is turned a high level to introduce a reset period, the IGFET $Q_{64}$ is rendered nonconductive whereas the IGFET $Q_{65}$ is rendered conductive so that the remote end we promptly is turned to a low level, i.e., so that the selected word line is brought into its reset condition. Simultaneously with this, the IGFET $Q_{61}$ is rendered conductive whereas the transistor $Q_{62}$ is rendered nonconductive so that the output signal takes a high level. Namely, the circuits $WDT_l''$ and $WDR_l''$ are brought into reset condition.

Figure 11:
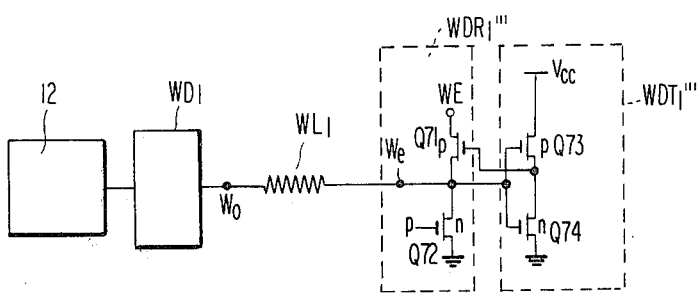
FIG. 11 is a circuit diagram showing a memory device according to a fourth embodiment of the present invention.

FIG. 11 shows a first embodiment of the present invention. In this embodiment, the word level detection circuit $WDT_l'''$ is similarly structured as in $WDT_l$ in FIG. 6. A select word drive circuit $WDR_l'''$ is composed of a P-channel IGFET $Q_{71}$ and an N-channel IGFET $Q_{72}$. A word enable timing signal WE which is produced within the memory device in response to the chip enable signal is applied to a drain of IGFET $Q_{71}$. IGFET $Q_{72}$ is used to reset the level of the word line in response to the precharge signal P.

The foregoing description is directed to the case, in which the circuits, $WDT_l$, $WDT_l'$ ... and $WDR_l$, $WDR_l'$ ... according to the present invention is disposed at the opposite position to that of the decoder circuit and the word drive circuit with respect to the word line with a view to reducing the signal delay especially in case the word line has a high wiring impedance. However, the effects of the present invention are not limited to the above cases.

Figure 12:
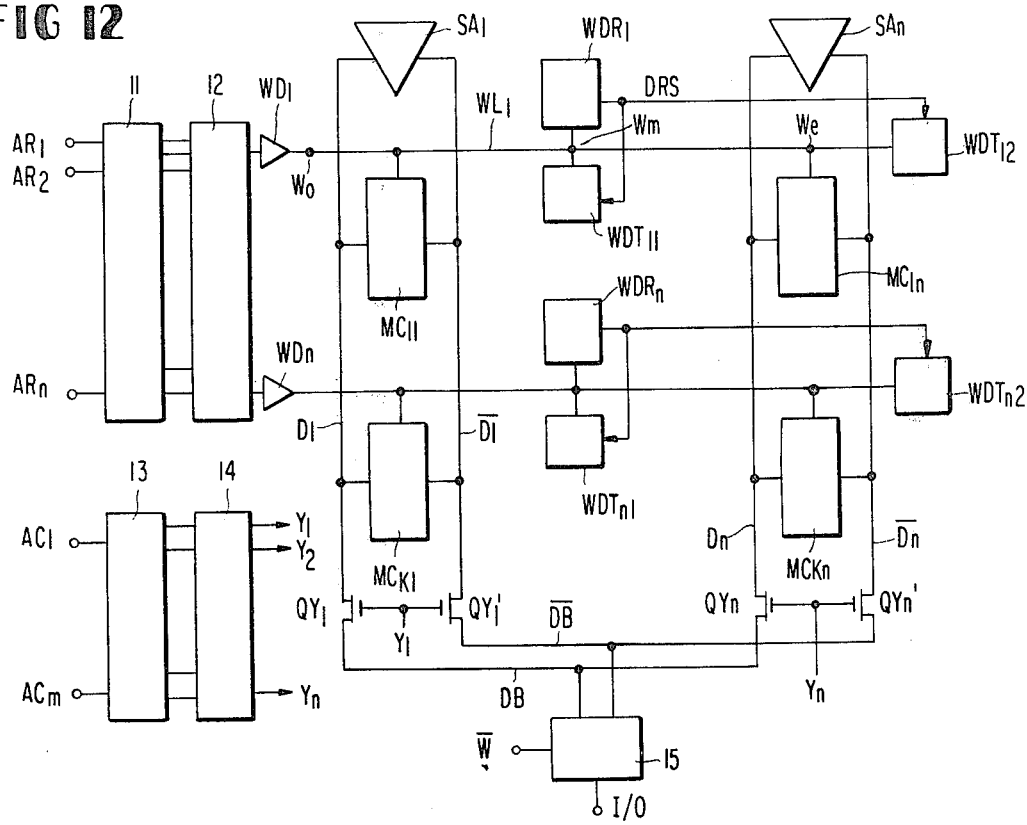
FIG. 12 is a circuit diagram showing a memory device according to fifth embodiment.

A sixth embodiment of the present invention will be described with reference to FIG. 12. In this embodiment, the word level detection circuit $WDR_l$ is disposed at a middle portion $W_m$ of the word line $WL_l$. With respect to one word line $WL_l$, two select word drive circuits $WDT_{11}$ and $WDT_{12}$ are disposed respectively at the middle portion $W_m$ and the remote end $W_e$ of the word line. The word level detection circuit $WDR_l$ and the select word drive circuits $WDT_{11}$ and $WDT_{12}$ may be constructed similarly in the preceding embodiments.

Another embodiment attaining the effects of the present invention will be described in the following.

Figure 13:
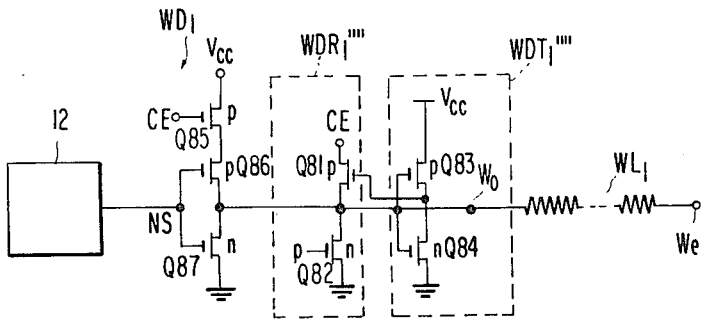
FIG. 13 is a block diagram showing a major part of a memory device according to a sixth embodiment of the present invention.
Figure 14:
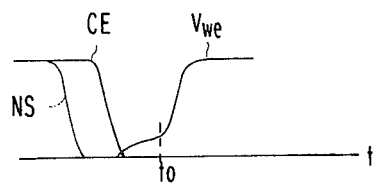
FIG. 14 is a waveform diagram showing an operation of the circuit of FIG. 11.

FIG. 13 is a circuit diagram showing a seventh embodiment of the present invention, and FIG. 14 is a timing chart of the same, in which a wave form $V_{we}$ shows the level at the portion $W_e$ of the word line. In this embodiment, the word level detection circuit $WDR_l''''$ are disposed at the near end $W_o$ of the word line $WL_l$. The circuits $WDT_l''''$ and $WDR_l''''$ are substantially the same as the circuits $WDT_l'''$ and $WDR_l'''$ in FIG. 11 except that the chip enable signal CE is applied to a drain of a P-channel IGFET $Q_{81}$ in place of the WE. When the output $N_8$ of the decoder circuit 12 is turned to a low level and the chip the chip enable signal CE is turned to the a low level, IGFETs $Q_{85}$ and $Q_{86}$ are rendered conductive so that the selected word line $WL_l$ is started to rise up to the final level $V_{cc}$. Here, when the selected word line WL reaches a certain level, the word level detection circuits $WDT_l''''$ detects that level to start its operation. If the driving capacity of the IGFET $Q_{81}$ in the select word drive circuit $WDR_l''''$ is preset larger than those of IGFETs $Q_{85}$ and $Q_{86}$ in the word drive circuit $WD_l$, the selected word line $WL_l$ has its rising gradient steepened at a time $t_o$, as shown in FIG. 14, so that the arrival time at the final time is shortened in comparison with the case, in which the select word line drive circuit $WDR_l''''$ is not added. On the contrary, in case the afore-mentioned arrival time is made the same, the dimensions of the IGFETs $Q_{85}$ and $Q_{86}$ can be reduced together with the load capacity of the signal CE.

Although the foregoing description is directed to the memory circuit, it is needless to say that the gist of the present invention should not be restricted thereto but can be extended to a general application, in which the signal of a signal line is intended to be self-amplified.

I claim:

1. A memory device comprising: a plurality of word lines having a predetermined length; a plurality of digit lines; a plurality of memory cells coupled to the word lines and the digit lines, each of said memory cells being responsive to a selection level on an associated one of said word lines to put said associated one of said word lines in such a state that data is transferred between it and an associated one of said digit lines; means for receiving a plurality of address signals; a word decoder circuit having a plurality of decode outputs not more in number than the number of said word lines, said word decoder circuit selectively enabling one of said decode outputs in response to the address signals; a plurality of word driver circuits each coupled to a first end of an associated word line and to an associated decode output, each said driver circuit supplying said first end of an associated one of said word lines with a selection signal in response to an enabled decoder output; a plurality of word level detection circuits each coupled to a second end of an associated one of said word lines opposite said first end, said word level detection circuits detecting level changes towards said selection level at said second ends of said word lines caused by associated word driver circuits; and a plurality of auxiliary word driver circuits each coupled to said second end of associated ones of said word lines and to an associated word level detection circuit, each said auxiliary word drive circuit providing said second end of its associated word line with a signal having the same polarity as said selection signal when the associated word level detection circuit detects said level change, whereby a time period required to set an entire selected word line at a selection level is reduced.

2. The memory device according to claim 1, in which said word lines are made of polycrystalline silicon.

3. The memory device according to claim 1, in which each of said word level detection means includes an inverter circuit having an input terminal coupled to the second end of the associated word line.

4. The memory device according to claim 1, in which each of said memory cells includes a flip-flop circuit and a transfer gate coupled between an output terminal of said flip-flop circuit and the associated digit line and having a control terminal coupled to the associated word line.

5. A memory device comprising: a plurality of word lines, each of said word lines having capacitance and resistance distributed along its longitudinal direction; a plurality of digit lines intersecting with said word lines; a plurality of memory cells disposed at intersections of said word lines and said digit lines; a plurality of first word drive means each coupled to a first portion of an associated one of said word lines for operatively applying an energization potential to said first portion of said associated one of said word lines; means responsive to address signals for selectively enabling one of said first word drive means; a plurality of detection means each coupled to an associated one of said word lines for detecting level changes caused by application of said energization potential to said first portion of its associated word line; and a plurality of second word drive means each coupled to a second different portion of an associated one of said word lines and to an associated one of said detection means, said second word drive means operatively applying the energization potential to said second portion of said associated one of said word lines when the associated detection means detects said level change.

6. The memory device according to claim 5, in which said word lines are made of polycrystalline silicon.

7. The memory device according to claim 5, in which each of said detection means includes an inverter circuit having an input terminal coupled to the associated word line.

8. The memory device according to claim 7, in which said second word drive means includes switch means coupled between a source of the energization potential and said associated one of said word lines and having a control terminal coupled to an output of said inverter.

9. A memory device comprising: at least one word line having a relatively slow propagation velocity in its longitudinal direction; a plurality of digit lines intersecting with said word lines; a plurality of memory cells disposed at intersections of said word line and said digit lines; a word drive circuit coupled to a first end of said word lines for operatively applying an energization potential to said first end of said word line thereby to transfer data between said memory cells and said digit lines; a first voltage terminal; a second voltage terminal; a first field effect transistor of a first channel type having a gate coupled to a second end of said word line opposite said first end and a source coupled to said first voltage terminal; a second field effect transistor of a second channel type opposite said first channel type having a gate coupled to said second end of said word line, a drain coupled to said second voltage terminal and a source connected to a drain of said first field effect transistor; a third field effect transistor of said second channel type having a gate coupled to said drain of said first field effect transistor and a source coupled to said second end of said word line; and supply means for supplying a drain of said third field effect transistor with said energization potential.

10. The memory device according to claim 9, further comprising: a fourth field effect transistor of said first channel type having a drain coupled to said second end of said word line and a source coupled to said first voltage terminal; and means for supplying a gate of said fourth field effect transistor with a control signal.

11. The memory device according to claim 10, in which said supply means includes a fifth field effect transistor of said second channel type having a drain coupled to said second voltage terminal and a source coupled to said source of said third field effect transistor, and means for supplying a gate of said fifth field effect transistor with a control signal.

12. A memory device comprising: a plurality of word lines each having a predetermined propagation velocity in its longitudinal direction; a plurality of digit lines intersecting said word lines; a plurality of memory cells disposed at intersections of said word lines and said digit lines; means for receiving address signals; a plurality of first word driver circuits each coupled to a first end of an associated word line, each of said first word driver circuits selectively applying an energization potential to said first end of its associated word line in response to address signals; a plurality of second word driver circuits each coupled to a second end of an associated one of said word lines opposite said first end, each of said second word driver circuits operatively applying said energization potential to said second end of said associated one of said word lines; and a plurality of control means each coupled to an associated one of said second word driver circuits, each of said control means enabling its associated second word driver circuit to apply said energization signal when an associated one of said first word driver circuits applies said energization signal to said first end of the same word line.

13. A semiconductor device comprising: at least one signal line made of polycrystalline silicon, said signal line having capacitance and resistance distributed along its longitudinal direction; a plurality of load means each coupled to a different portion of said signal line; first means for operatively applying an energization potential to a first portion of said signal line; second means coupled to a second portion of said signal line for detecting a level change towards to said energization potential on said second portion, said second portion being relatively far from said first portion; and second means coupled to said detection means for operatively applying a potential having the same polarity as that of said energization potential to a third portion of said signal line when said detection means detects said level change, said third portion being relatively far from said first portion, whereby a time period required to drive said signal line towards said energization potential is reduced.

14. A semiconductor device comprising: at least one signal line made of polycrystalline silicon and having a predetermined propagation velocity in its longitudinal direction; first means coupled to a first portion of said signal line for operatively applying an energization potential to said first portion; a first voltage terminal; a second voltage terminal; a first field effect transistor of a first channel type having a gate coupled to a second portion of said signal line remote from said first portion and a source coupled to said first voltage terminal; a second field effect transistor of a second channel type opposite said first channel type having a gate coupled to said second portion of said signal line, a drain coupled to said second voltage terminal and a source coupled to a drain of said first transistor; a third field effect transistor of said second channel type having a gate coupled to said drain of said first transistor and a source coupled to said second portion of said signal line; and means for supplying a drain of said third transistor with said energization potential.

15. The device according to claim 14, further comprising: a fourth field effect transistor of said first channel type having a drain coupled to said second portion of said signal line and a source coupled to said first voltage terminal; and means for supplying a gate of said fourth transistor with a control signal.

* * * * *

UNITED STATES PATENT AND TRADEMARK OFFICE
CERTIFICATE OF CORRECTION

PATENT NO. : 4,338,678
DATED : July 6, 1982
INVENTOR(S) : Yasuo AKATSUKA

It is certified that error appears in the above—identified patent and that said Letters Patent is hereby corrected as shown below:

Column 1, line 16, delete "impeadance" insert --impedance--

Column 3, line 48, delete paragraphing, continue with paragraph on line 47

Column 4, line 63, delete "first" insert --fifth--

Column 5, line 37, delete "the chip the chip" insert --the chip--

Column 5, line 38, delete "to the a low level" insert --to a low level--

Signed and Sealed this

Twenty-first Day of September 1982

[SEAL]

Attest:

GERALD J. MOSSINGHOFF

Attesting Officer    Commissioner of Patents and Trademarks